United States Patent [19]

Suzuki et al.

[11] Patent Number: 4,710,803
[45] Date of Patent: Dec. 1, 1987

[54] COLOR FILTER AND COLOR IMAGE SENSOR USING THE SAME

[75] Inventors: Kenji Suzuki; Takaaki Terashita; Jin Murayama, all of Kanagawa, Japan

[73] Assignee: Fuji Photo Film Co., Ltd., Kanagawa, Japan

[21] Appl. No.: 11,421

[22] Filed: Feb. 3, 1987

[30] Foreign Application Priority Data

Feb. 5, 1986 [JP] Japan .................................. 61-22155

[51] Int. Cl.⁴ .......................... H04N 9/04; H04N 9/07
[52] U.S. Cl. ........................................ 358/41; 358/43; 358/44
[58] Field of Search ..................... 358/41, 43, 44, 48

[56] References Cited

U.S. PATENT DOCUMENTS 2,674,649  4/1954  Wetzel .................... 358/44
4,500,915  2/1985  Koike et al. ............. 358/48 X Primary Examiner—James J. Groody
Assistant Examiner—E. Anne Faris
Attorney, Agent, or Firm—Young & Thompson

[57] ABSTRACT

A color filter has color areas of N (N is integer 3 or more) different colors, each color area having an L shape. A color image sensor has a matrix of photoelectric conversion cells on which a color filter with a color area arranged in an L shape is formed. Each of the photoelectric conversion cells of a matrix form is grouped in units of X×Y (X and Y each are integer 3 or more) cells to constitute a pixel group. Signal charges stored in photoelectric conversion cells of the same color are added and read within the same picture group.

7 Claims, 5 Drawing Figures

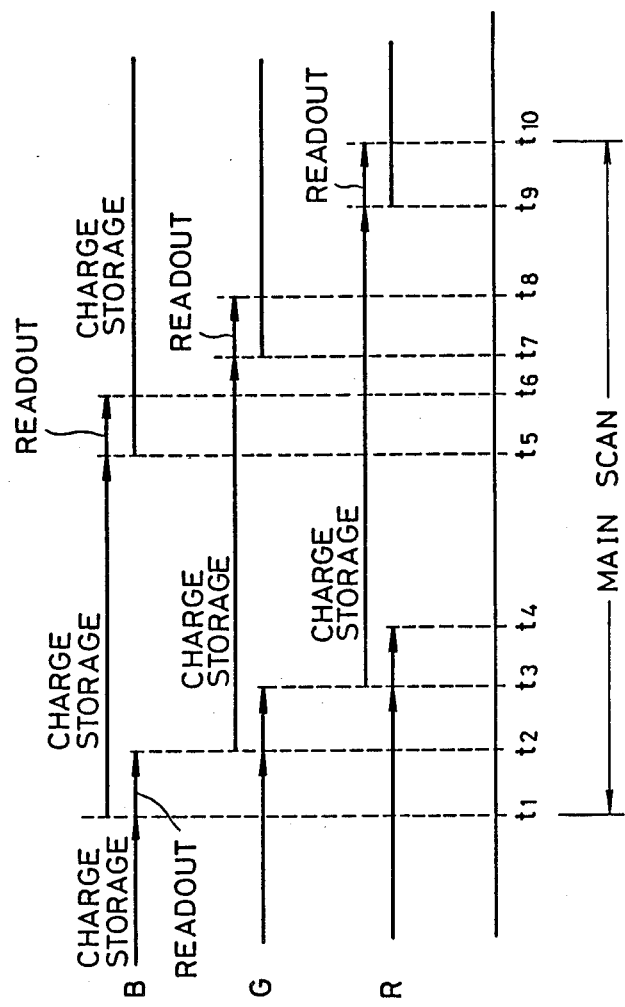

COLOR FILTER AND COLOR IMAGE SENSOR USING THE SAME

BACKGROUND OF THE INVENTION

The present invention relates to a color filter and a color image sensor using the same.

A recently developed color printer reproduces a well-balanced color print by classifying a color original (such as a color negative film) into a plurality of scenes and regulating the degree of insertion of a color correction filter into an optical path of each scene. To classify a color original into plural scenes, a color image sensor has been used to measure three color densities of the color original at each point of measurement thereon.

To read a color original, either a three-image type scanner or a single-image type sensor is used. With the former, three colors are separately measured by disposing three color filters, e.g. blue, green and red, at the light-receiving surface of each image sensor. With the latter method, a color filter with a mosaic pattern of blue color area, green color area and red color area is disposed at the receiving surface of the image sensor, which is cost effective.

With the latter single-image type color image sensor, three color signals for each pixel are mixed and collected by the scanner. Thus, the signal processing, such as color correction, becomes complicated, and it become necessary to separate the three colors for storing the respective three color signals in a memory. Furthermore, it is desirable to set a different charge storage time for each color based on incident light to broaden the dynamic range of the color image sensor and to obtain a signal with low noise.

To read a color signal independently for each color using a MOS type color image sensor, it is necessary to provide horizontal and vertical signal lines for each color. However, in a conventional color image sensor, there is used a color filter whose color areas of the same color are not disposed in contact relation to each other, so that three horizontal and three vertical signal lines must be provided to surround each photoelectric conversion cell. This results in complicated wiring and a limited light-receiving area for photoelectric conversion cells because of the wiring space needed, thereby limiting the aperture and hence the sensitivity.

OBJECTS OF THE INVENTION

It is a principal object of the present invention to provide a color filter and a color image sensor using the same, which can reduce the amount of wiring within the matrix of photoelectric conversion cells and thus ensure a simple construction.

It is another object of the present invention to provide a color filter and a color image sensor using the same, which can make possible the provision of light-receiving areas of photoelectric conversion cells by reducing the amount of wiring.

SUMMARY OF THE INVENTION

To achieve the above objects, a color filter according to the present invention has $(N-1)$ colors disposed in each row and in each column in an L shape, wherein N is an integer more than 3. Using this color filter, $(N-1)$ signal lines for each row and column are required so that the amount of wiring is reduced and hence the area for photoelectric conversion cells can be made large. According to a preferred embodiment of the present invention, red, green and blue colors are used for N colors and each color area is of L shape (including inverted L shape) disposed in a regular pattern.

When separately measuring three colors using a single-image type color sensor, since a pixel group is made of three types of pixels disposed side by side and each pixel measures a different point, error in color registration is inevitably generated. To solve this problem, a color image sensor according to the present invention uses a color filter having $(N-1)$ colors in the shape of an L disposed in each row and in each column, and a pixel group is made up of $X \times Y$ photoelectric conversion cells, wherein N, X and Y are each an integer more than 3.

It is necessary to add signal charges of the same color within a single pixel group. However, according to the present invention, in order to dispense with separate adders used after reading signal charges, signal charges stored in photoelectric conversion cells of the same color are picked up while reading them. Various methods may be adopted for such addition. According to one example, vertical MOS switches corresponding in number to the colors are provided for each pixel group and photoelectric conversion cells are connected to the source of a vertical MOS switch of the corresponding color, while to the gate thereof their horizontal signal lines are connected and to the drain their vertical signal lines. With such an arrangement, in the case wherein a single pixel group is made of $3 \times 3$ matrix photoelectric conversion cells of red, green and blue colors, for example, only a single signal line may suffice for each row and column, which reduces the number of signal lines by one as compared with the case wherein a vertical MOS switch is provided independently for each photoelectric conversion cell.

The combination of colors of the color filter may be red, green and blue, but specific colors such as flesh color may be added thereto. Another example of a color combination may be cyan, magenta and yellow.

In a color filter according to this invention, the amount of wiring in a color image sensor can be reduced. The light-receiving area of each photoelectric cell can correspondingly be made large and hence the aperture can be increased to improve the sensitivity of each photoelectric conversion cell. Furthermore, according to this invention, each color area has a uniform L shape so that the manufacture thereof is simple and there is little fear of peeling-off of the filter from the sensor. In addition, the photoelectric conversion cells of the same color can be uniformly distributed in the sensor.

In a color image sensor according to this invention, a single pixel group is made up of $X \times Y$ pixels, and signal charges of the same color are added within the pixel group and picked up so that it is possible to eliminate color registration. Furthermore, since pixels of the same color are positioned side by side, the wiring for adding signal charges is simplified.

BRIEF DESCRIPTION OF THE DRAWINGS

FIG. 5 is a timing chart showing the timing of charge storage and signal readout.

DETAILED DESCRIPTION OF THE INVENTION

Figure 1:
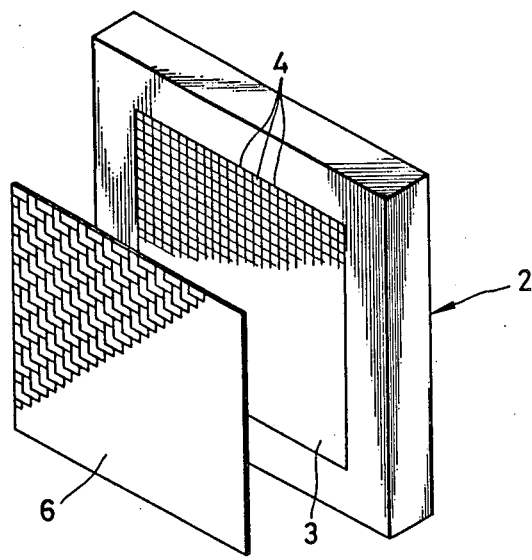
FIG. 1 is a perspective view of a color image sensor with its color filter removed, according to the present invention.

FIG. 1 shows a color image sensor. Disposed on a light-receiving surface of an IC chip 2 is a plurality of photoelectric conversion cells 4 in a matrix format. A color filter 6 having a plurality of different color areas of L shape is attached on the light-receiving surface 3. Instead of attaching the filter 6, a filtering substance may be directly deposited on the light-receiving surface 3 using a known photo-etching technique.

Figure 2:
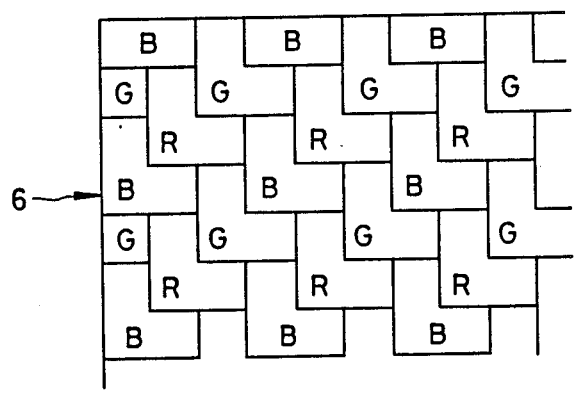
FIG. 2 is an enlarged plan view of a part of the color filter.

FIG. 2 is an enlarged diagrammatic view of the color filter, wherein R denotes an area for selectively passing red color, G denotes an area for selectively passing green color, and B denotes an area for selectively passing blue color. These color areas may be formed by depositing colored substances on a transparent filter base using a known photo-etching technique. The color filter lacks one color for each row and column. For instance, red is missing from the first row and blue from the second row. In this embodiment, the color area may be of continuous L shape, overlying three photoelectric conversion cells, or it may be made up of separate pieces positioned one over each of the three photoelectric conversion cells.

Figure 3:
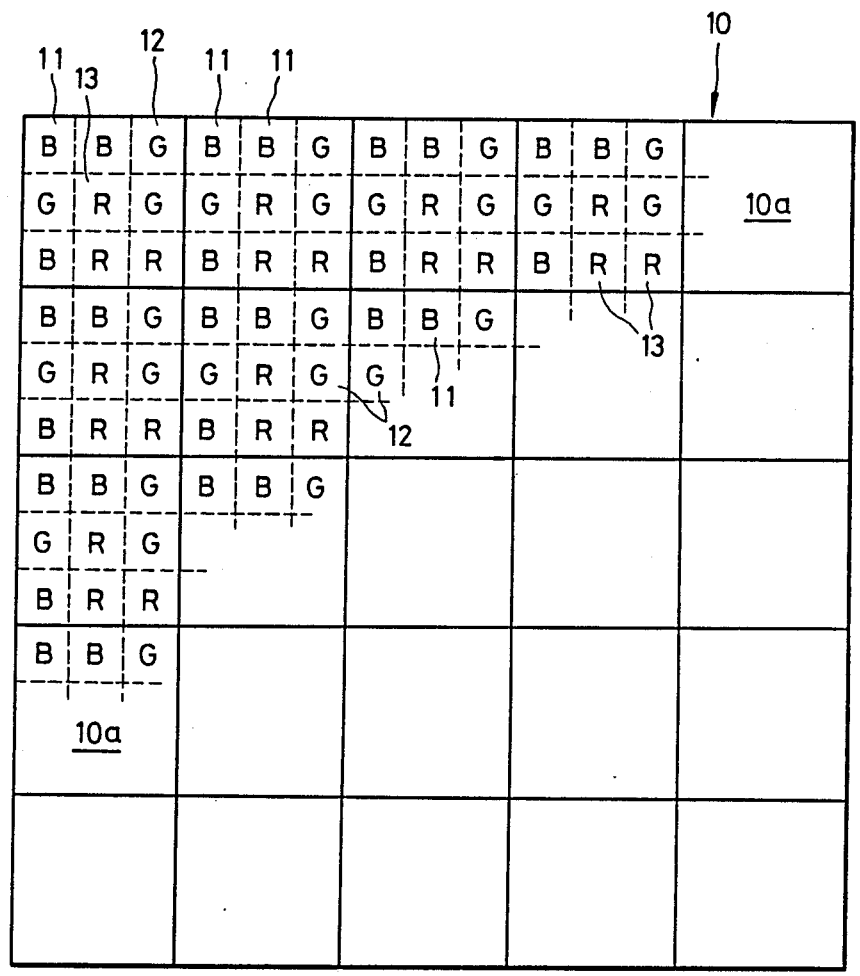
FIG. 3 illustrates the arrangement of a color image sensor according to the present invention, wherein a single pixel group is made up of X×Y pixels.

FIG. 3 shows the arrangement of a color image sensor wherein signal charges of the same color within one pixel group are added together and picked up. The color image sensor 10 is constructed of, in a matrix arrangement, blue pixels 11 for photoelectrically converting blue light into a signal charge and storing it, green pixels 12 for photoelectrically converting green light into a signal charge and storing it, and red pixels 13 for photoelectrically converting red light into a signal charge and storing it. These pixels are constructed, as described previously, of photoelectric cells and color areas arranged thereupon. In the matrix arrangement, pixels of the same color are disposed in an L shape. To eliminate color registration, the pixels are divided into pixel groups 10a. In this embodiment, each pixel group 10a has three rows and three columns, i.e., 3×3=9 pixels. In this figure, a pixel is surrounded by dotted lines, and pixel group is surrounded by solid lines.

Figure 4:
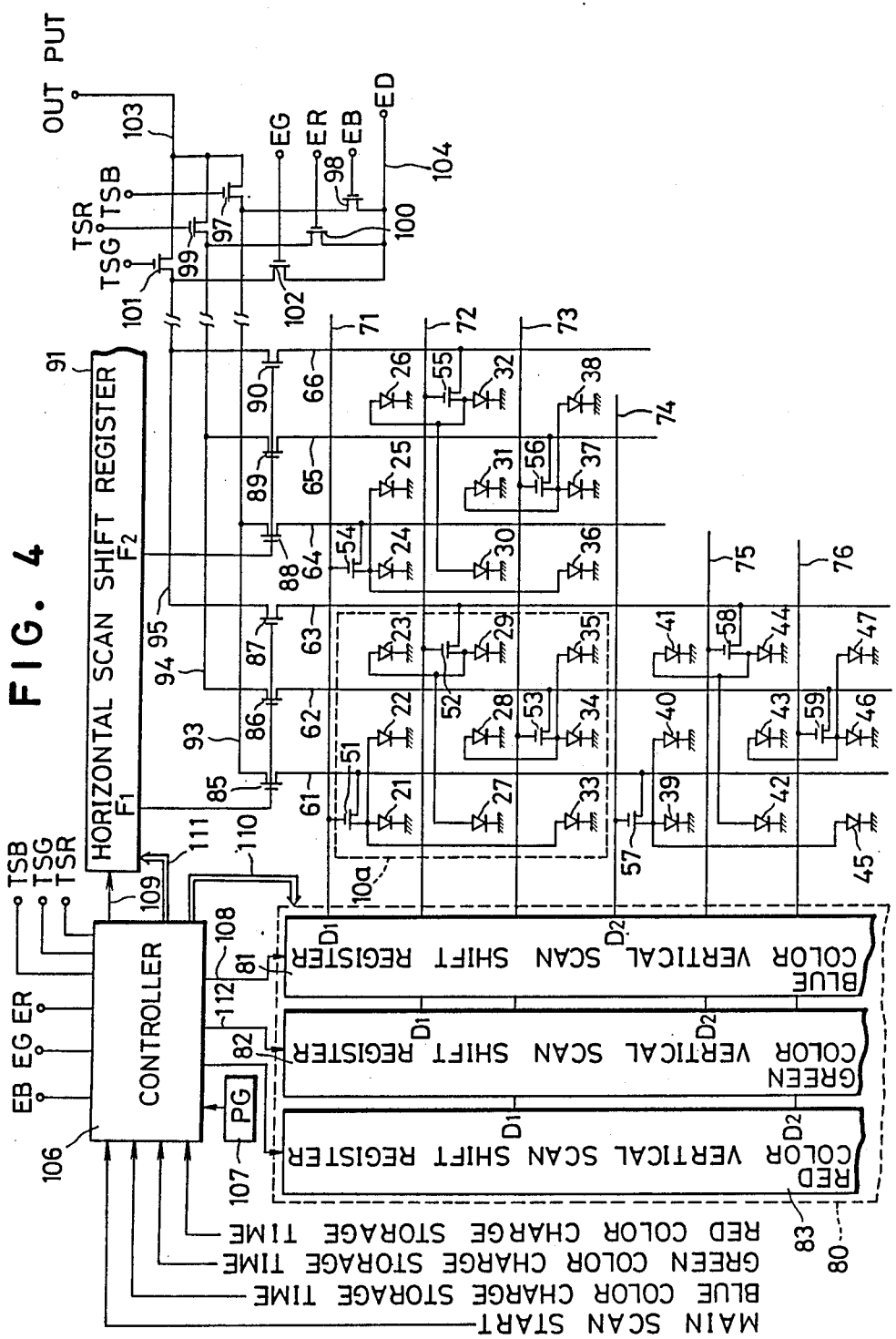
FIG. 4 is a circuit diagram showing an example of an MOS-type color image sensor according to the present invention, wherein signal charges of the same color within a pixel group are added and picked up.

FIG. 4 shows an example of a MOS color image sensor using the pixel arrangement shown in FIG. 3. Photoelectric conversion cells are each shown by an equivalent photodiode. In this figure, photodiodes 21 to 47 are exemplarily shown. These photodiodes convert incident light into signal charges and store them in floating capacitors. Photodiodes 21, 22, 24, 25, 33, 36, 39, 40 are 45 are used for blue color, photodiodes 23, 26, 27, 29, 30, 32, 41, 42 and 44 are for green color, and photodiodes 28, 31, 34, 35 37, 38, 43, 46 and 47 are for red color. The photodiodes 21 to 23, 27 to 29 and 33 to 35 constitute a pixel group in the first row and the first column. To add signal charges of the same color within the pixel group, three vertical MOS switches 51 to 53 are provided. Blue color photodiodes 21, 22 and 33 are connected to the blue color vertical MOS switch 51.

When the blue color vertical MOS switch 51 turns ON, three signal charges are picked up at the same time from a blue color vertical line 61 connected to the drain thereby to add signal charges within the pixel group. Green color photodiodes 23, 27 and 29 are connected to the source of the green color vertical MOS switch 52. When the green color vertical MOS switch turns ON, three signal charges are picked up at the same time from a green color vertical line 62 to add signal charges. Similarly, when the red color MOS switch 53 turns ON, three signal charges are added and picked up from a red color vertical line 63.

A pixel group in the first row and the second column is constructed of photodiodes 24 to 26, 30 to 32, and 36 to 38. To add signal charges of the same color and pick them up, three vertical MOS switches 54 to 56 are provided. Vertical lines 64 to 66 are respectively connected to the drains of the vertical MOS switches 54 to 56. A pixel group at the second row and the first column is constructed of photodiodes 39 to 41, 42 to 44, and 45 to 47. To add signal charges of a same color and pick them up, three vertical MOS switches 57 to 59 are provided. Vertical lines 61 to 63 are connected to the vertical MOS switches 57 to 59.

In the photodiode matrix, one vertical line and one horizontal line are provided for each row and column. Particularly, a blue color horizontal line 71 is disposed on the first row, a green color horizontal line 72 is disposed on the second row, and a red color horizontal line 73 is disposed on the third row. Similarly, a blue color horizontal line 74 is disposed on the fourth row, a green color horizontal line 75 is disposed on the fifth row, and a red color horizontal line 76 is disposed on the sixth row. These signal lines are formed by means of aluminum deposition. Since only a single signal line suffices for each row and each column, the wiring is simplified, and further the light-receiving surface of a photodiode is enlarged to a degree corresponding to the reduction in the amount of wiring.

Vertical scan means 80 is constructed of a blue color vertical scan shift register 81, a green color vertical scan shift register 82, and a red color vertical scan shift register 83. The blue color horizontal line 71 is connected to the first output terminal D1 of the blue color vertical scan shift register 81, and the blue color horizontal line 74 is connected to the second output terminal D2. The green color horizontal line 72 is connected to the first output terminal D1 of the green color vertical scan shift register 82, and the green color horizontal lie 75 is connected to the second output terminal D2. Furthermore, the red color horizontal line 73 is connected to the first output terminal D1 of the red color vertical scan shift register 83, and the red color horizontal line 76 is connected to the second output terminal D2.

The vertical lines 61 to 66 are respectively connected to the sources of horizontal MOS switches 85 to 90. The horizontal MOS switches 85 to 87 are used for picking up three color signals from the pixel groups in the first column, the gates of which are connected to the first output terminal F1 of a horizontal scan shift register 91. The horizontal MOS switches 88 to 90 are used for picking up three color signals from the pixel groups in the second column, the gates of which are connected to the second output terminal F2 of the horizontal scan shift register 91.

A blue color output line 93 is connected to the drains of the blue color horizontal MOS switches 85 and 88, and a red color output line 94 is connected to the drains of the red color horizontal MOS switches 86 and 89. Similarly, a green color output line 95 is connected to the green color horizontal MOS switches 87 and 90. Connected to the blue color output line 93 are: a MOS switch 97 for picking up effective signals, and a MOS switch 98 for draining signals read while periodically driving the color image sensor 10. Similarly, two MOS switches 99 and 100 are connected to a red output line 94, and two MOS switched 101 and 102 are connected to a green ouput line 95. The drains of the MOS switches 97, 99 and 101 are picking up effective signals are connected to a single ouput line 103, while the drains of the MOS switches 98, 100 and 102 for draining unnecessary signals are connected to a single reset line 104.

The operation of the vertical scan means 80 and the horizontal scan shift register 91 is controlled by a controller 106 to scan each pixel group and pick up each signal. The color image sensor 10 is actuated at a predetermined period, and it is necessary to drain unnecessary signals and pick up only effective signals. To this end, the controller 106 outputs EB, ER and EG signals for use in draining unnecessary signals to turn ON the MOS switches 98, 100 and 102, and outputs TSB, TSR and TSG signals for use in picking up effective signals to turn ON the MOS switches 97, 99 and 101. The controller 106 is further inputted with a start signal for a main scan and with a signal for setting charge storage time for each color. Reference numeral 107 denotes a pulse generator.

Superposition of color signals is not permitted in the embodiment of FIG. 4. However, superposition may be performed by independently providing a horizontal scan shift register for each color and independently providing an output line 103 for each color.

Next, the operation of the embodiment shown in FIG. 4 will be described with reference to FIG. 5. First, to broaden the dynamic range and obtain a signal having low noise, the charge storage time for each color is determined so as to have the maximum output value of the photoelectric conversion means near its saturation value. This value is set in the controller 106. The controller 106 drives the color image sensor 10 at a predetermined period in an ordinary scan to sequentially pick up three color signals. The readout signals during the ordinary scan are not needed, so they are drained from the reset line 104. Specifically, the controller 106 actuates the vertical scan means 80 and the horizontal scan shift register 91 and outputs an EB, EG or ER signal for a color signal being read, thereby to turn ON the MOS switch 98, 100 or 102 to drain a read-out signal to the reset line 104.

When a color original is placed in the reading position, the controller 106 is supplied with a readout start signal. Upon reception of this readout start signal, a main scan starts in synchronism with a vertical synchro signal for a color signal to be first read. In this embodiment, a blue color signal is first read, so the main scan starts at time t1.

At time t1 when the main scan starts, the controller 106 outputs an EB signal to turn ON the MOS switch 98. Simultaneously therewith, the controller 106 supplies a shift pulse 108 to the blue color vertical shift register 81 and a shift pulse 109 to the horizontal scan shift register 81. The controller 106 supplies a clock pulse to the horizontal scan shift register 91 to perform a horizontal scan once. Every time a horizontal scan is completed, a clock pulse 110 is supplied to the vertical scan means 80 to perform vertical scan.

When a shift pulse 108 is inputted to the blue color vertical scan shift register 81, the first output terminal D1 becomes high "H". Simultaneously therewith, the first output terminal F1 of the horizontal scan shift register 91 becomes "H", so that the vertical and horizontal MOS switches 51 and 85 turn ON thereby to add signal charges stored in the blue photodiodes 21, 22 and 33 in the first row and in the first column and to pick them up from the blue color output line 93. These blue color signals are not needed, so they are drained via the MOS switch 98 to the reset line 104.

After the end of scanning the pixel group in the first row and in the first column, the horizontal scan shift register 91 is shifted by a clock pulse 111 so that the second output terminal F2 becomes "H" to read a blue color signal from the pixel group in the first row and in the second column. In this case, the vertical and horizontal MOS horizontal switches 54 and 88 turn ON thereby to add signal charges stored in the blue color photodiodes 24, 25 and 36 and to pick them up from the blue color output line 93, which are in turn drained via the MOS switch 98 to the reset line 104.

After the blue color signals for the pixel groups in the first row are read upon scanning the horizontal scan shift register 91 once, the controller supplies a clock pulse 110 to the vertical scan means 80, so that only the second output terminal D2 of the blue color vertical scan shift register 81 becomes "H". In this condition, the horizontal scan shift register 91 is scanned once similarly to the above case, to add signal charges stored in the blue color pixels within the same pixel group in the second row and to pick them up and to drain them to the reset line 104. Similarly, blue color signals in the third and following columns are sequentially read by scanning corresponding pixels. Reading blue color signals is carried out during time t1 to t2. Thus, the blue color pixels 11 of the image sensor 10 are sequentially reset in the unit of a pixel group to immediately thereafter start the charge storage for blue color pixels 11.

After resetting the blue color pixels 11 at time t2, green color pixels 12 start to be reset. In this case, the controller 106 supplies a shift pulse 112 to the green color vertical scan shift register 82 and a shift pulse 109 to the horizontal scan shift register 91 to add green color signals and read them from each pixel group in a similar manner as previously described. Reading green color signals is carried out during time t2 to t3 wherein green color pixels 12 for each pixel group are sequentially reset to start charge storage. After resetting green color pixels 12, the MOS switch 100 is turned ON to reset red color pixels 13 during time t3 to t4.

Blue color charge storage terminates at time t5. Signal charges stored in the blue color pixels 11 are added and sequentially read in the unit of a pixel group using the blue color vertical scan shift register 81 and the horizontal scan shift register 91. During the reading of blue color signals, the controller 106 outputs a TSB signal to turn ON the MOS signal 97 so that blue color time sequential signals added for each pixel group are picked up from the output line 103 and sent to a signal processing circuit (not shown). The signal processing circuit performs, as is well known, digital conversion, logarithmic conversion, color correction and the like to send obtained density signals to a microcomputer (not shown). Reading of the blue color signal is carried out during time t5 to t6.

When the green color charge readout is completed at time t7, the signal charges stored in the green color pixels 12 are added and sequentially read in the unit of a pixel group, using the green color vertical scan shift register 82 and the horizontal scan shift register 91. The read-out charges are sent to the output line 103 via the MOS switch 101 in an ON state. Reading the green color signal is carried out during time t7 to t8.

When the red color charge readout is completed at time t9 signal charges stored in the red color pixels 13 are added and seqentially read in the unit of a pixel group using the red color vertical shift register 83 and the horizontal scan shift register 91. The read-out charge are sent to the output line 103 via the MOS switch 99 in an ON state. Reading the red color signal is carried out during time t9 to t10.

With the above procedure, a main scan is performed during time t1 to t10 during which effective blue, green and red color signals are sequentially read. After the main scan, the controller 106 drives the image sensor for a predetermined period and drains the read-out signal to the reset line 104.

In the above embodiment, resetting during the mains can is performed independently for each color. However, if a reset signal is outputted from the controller and supplied at the same time to the gates of the MOS switches 98, 100 and 102, it is possible to reset the respective color pixels at the same time. Furthermore, to determine the charge storage time, it is preferable to perform a prescan before the main scan to check the amount of incident light for each color and automatically determine the charge storage time in accordance with the incident light quantity.

In the embodiment of FIG. 1, a single signal line is provided for each row and for each column. However, two signal lines may be provided independently for two color photodiodes in each row and in each column, such that vertical MOS switches provided independently for each photodiode are each connected to two signal lines (horizontal and vertical signal lines). Specifically, blue and green color horizontal lines are provided for the first row, red and green color horizontal lines are provided for the second row, and red and blue color horizontal lines are provided for the third row. Two horizontal lines for the same color are connected together to couple them to the first output terminal D1 of each of the vertical scan shift registers 81 to 83. Similarly, two vertical liens are provided for each column, and two vertical lines of the same color within the same pixel group are connected together to couple them to each of the horizontal MOS switches provided for the respective colors.

The color filter according to this invention is applicable not only when the signal charges stored in the photoelectric conversion cells are added within the same pixel group for each color and picked up, but also when signal charges are not added but a signal charge in each photoelectric conversion cell is separately picked up. Furthermore, the invention is also applicable to image sensors of a CCD type.

The invention is not intended to be limited only to the above embodiment, but various alternations and modifications are possible without departing from the spirit and scope of the appended claims.

What is claimed is:

1. A color filter having color areas of N colors, N being an integer at least equal to 3,
    each of said color areas being L-shaped and having a first leg and a second leg,
    said first legs being arranged in columns with portions of said second legs.
    said second legs being arranged in rows with portions of said first legs, and
    the number of different colors in each column and in each row being N−1.

2. A color filter according to claim 1, all the color areas of the same color being spaced from each other by color areas of different colors.

3. A color filter according to claim 1, wherein said N colors are red, green and blue.

4. In a color image sensor for converting color light passing through a color filter into a signal charge, said color filter having a matrix of photoelectric conversion cells and color areas of N colors arranged therein, N being an integer at least equal to 3, the improvement wherein:
    each of said color areas being L-shaped and having a first leg and a second leg,
    said first legs being arranged in columns with portions of said second legs.
    said second legs being arranged in rows with portions of said first legs, and
    the number of different colors in each column and in each row being N−1;
    a pixel group is made up of X×Y photoelectric conversion cells, X and Y each being an integer equal to at least 3; and
    means for storing signal charges of a same color in said photoelectric conversion cells and for adding and picking up said signal charges during reading of a signal from each pixel group.

5. A color image sensor according to claim 4, wherein each of said integers N, X and Y is 3.

6. A color image sensor according to claim 5, wherein said photoelectric conversion cell is of a MOS type.

7. A color image sensor according to claim 6, wherein
    three vertical MOS switches respectively for red, green and blue colors are provided for each pixel group,
    three photoelectric conversion cells are connected to the source of each vertical MOS switch which corresponds in color to that of said three photoelectric conversion cells, and
    signal charges stored in said photoelectric conversion cells within a pixel group are added and picked up from the drain at the same time via said each vertical MOS switch in an ON state.

* * * * *